(12) United States Patent
Tai et al.

(10) Patent No.: US 8,471,316 B2
(45) Date of Patent: Jun. 25, 2013

(54) ISOLATION AREA BETWEEN SEMICONDUCTOR DEVICES HAVING ADDITIONAL ACTIVE AREA

(75) Inventors: Hsin-Chih Tai, San Jose, CA (US); Keh-Chiang Ku, Cupertino, CA (US); Duli Mao, Sunnyvale, CA (US); Vincent Venezia, Los Gatos, CA (US); Gang Chen, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 6 days.

(21) Appl. No.: 13/227,099

(22) Filed: Sep. 7, 2011

(65) Prior Publication Data

US 2013/0056808 A1   Mar. 7, 2013

(51) Int. Cl.
*H01L 31/062* (2012.01)

(52) U.S. Cl.
USPC .................. 257/292; 257/291; 257/E27.132; 257/E27.133

(58) Field of Classification Search
USPC .................. 257/258, 291, 292, 461, E31.093, 257/E27.132, E27.133; 438/66, 73
See application file for complete search history.

(56) References Cited

U.S. PATENT DOCUMENTS

2009/0001496 A1* 1/2009 Katayama ..................... 257/435

OTHER PUBLICATIONS

Assaf Lahav, et al., "Optimization of Random Telegraph Noise Non Uniformity in a CMOS Pixel with a Pinned-Photodiode", Tower Semiconductor Ltd., P.O. Box 619 Migdal Haemek, Israel, e-mail:asafla@towersemi.com, TEL: (972)-4-6505063, Fax:(972)-4-6547788, Biomorphic VLSI Inc., 4 pgs.

Xinyang Wang, et al., "A CMOS Image Sendsor with a Buried-Channel Source Follower", ISS002008/ Session 2/ Image Sensors & Technology/ 2.10, 2008 IEEE International Solid-State Circuits Conference 978-1-4244-2011-7/08/$25.00 (c) 2008 IEEE, 3 pages.

Scott T. Martin and G.P. Li, "Modeling the Bias and Scaling Dependence of Drain Current Fluctuations Due to Single Carrier Trapping in Submicron MOSFET's", Advanced Semiconductor Device Research Laboratory, Department of Electrical and Computer Engineering, Univeristy of California, Irvine, California 92717, p. 116 and 117.

James Janesick, "Charge coupled CMOS and Hybrid Detector Arrays", Sarnoff Corporation, 4952 Warner Ave., Suite 300, Huntington Beach, CA 92649, Headquarters: CN5300, 201 Washington Road Princeton, NJ 08543-5300, SPIE, San Diego, Focal Plane Arrays for Space Telescope, paper #5167-1, Aug. 2003, 18pgs.

Martin-Gonthier, Philippe, Magnan, Pierre "Low Frequency Noise Impact on CMOS Image Sensors." In 24th Conference on Design of Cicuits-DCIS 09, 2009, 10 pages.

(Continued)

*Primary Examiner* — Tucker Wright
(74) *Attorney, Agent, or Firm* — Blakely Sokoloff Taylor & Zafman LLP

(57) ABSTRACT

An isolation area that provides additional active area between semiconductor devices on an integrated circuit is described. In one embodiment, the invention includes a complementary metal oxide semiconductor transistor of an image sensor having a source, a drain, and a gate between the source and the drain, the transistor having a channel to couple the source and the drain under the influence of the gate, and an isolation barrier surrounding a periphery of the source and the drain to isolate the source and the drain from other devices, wherein the isolation barrier is distanced from the central portion of the channel.

14 Claims, 7 Drawing Sheets

OTHER PUBLICATIONS

Xiangli Li, Mosfet Modulated Dual Conversion Gain CMOS Image Sensors, A Dissertation Submitted in Partial Fulfillment of the Requirements for the Degree of Doctor of Philosophy in Electrical and Computer Engineering, Boise State University, Nov. 2008, 173 pages.

P. Martin-Gonthier, P. Magnan, "RTS Noise Impact in CMOS Image Sensors Readout Circuit", Universite de Toulouse, ISAE, 10 avenue E. Belin, 31055, Toulouse, France, Philippe.martin-gonthier@isae.fr, 978-1-4244-5091-6/09/$25.00 (c) 2009 IEEE, pp. 928-931.

* cited by examiner

US 8,471,316 B2

ISOLATION AREA BETWEEN SEMICONDUCTOR DEVICES HAVING ADDITIONAL ACTIVE AREA

TECHNICAL FIELD

The present disclosure relates generally to integrated circuits, and more particularly, to the reduction of random telegraph signal noise in complementary metal oxide semiconductor image sensor circuits.

BACKGROUND INFORMATION

In an integrated circuit, designers seek to increase the circuit density. In other words, designers seek to place more electronic devices in the same amount of space. The active devices are located in what is referred to active areas. The other areas are filled with insulators, spacers, or gaps that simply cannot be used due to the limitations of a particular layout design or the fabrication equipment.

In optical sensors, designers seek to increase the amount of space used for photodiodes (or any other type of optical sensor) as compared to other devices. This allows for larger photosites or for more photosites in the same amount of space, increasing the quality of the sensor output, or decreasing the total size of the sensor with the same quality, or both. For an optical sensor, increasing the amount of active area for the same amount of total area can allow for higher quality circuitry or for the space used for electronic devices other than photosites to be reduced.

STI (Shallow Trench Isolation) and STI implant protection are used in integrated circuits to protect devices from other nearby devices. STI is particularly useful to protect against devices that accumulate a charge, such as capacitors, photodiodes, and power supply components. When transistors use STI and STI implant protection, the width of the active area of the device becomes much smaller. For a transistor, the active area under a gate area will typically be reduced. As a result, the device is rendered less effective or must be made larger to accommodate the STI and STI implant protection.

For photodiodes and sensor arrays, as processes scale down and devices become smaller, the amount of charge accumulated by the photodiodes becomes smaller. As the level of signal is reduced, the signal-to-noise ratio becomes smaller. In order to maintain the same signal quality, the noise levels must also be reduced. One source of noise in sensor arrays is RTS (Random Telegraph Signal) noise, although there are other noise sources as well. RTS noise is caused, at least in part, by defects at interfaces between Si and $SiO_2$ layers in the system. It is believed that charge carriers are trapped and detrapped at these interface defects. The measured charge at the other side of the defect will be increased or decreased randomly as charge flows across the defect. While such noise can cause problems in a variety of devices, it has a noticeable effect with an in-pixel source-follower transistor. At low light levels, RTS noise from the source-follower is a significant noise source limiting imaging quality.

A variety of noise reduction techniques are used to reduce the impact of RTS noise. Correlated double sampling, for example, reduces the impact of a variety of random noise sources. However, it does not completely eliminate RTS noise. The pixel can also be physically modified to reduce the impact of RTS and other noise sources. A buried channel source-follower has less RTS noise. This may be because the buried channel pushes the highest potential in the channel away from the Si—$SiO_2$ interface, minimizing the possibility of carriers being trapped by defects at Si—$SiO_2$ interfaces. These approaches all require more area, reducing the pixel density and increasing cost.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Figure 1A:
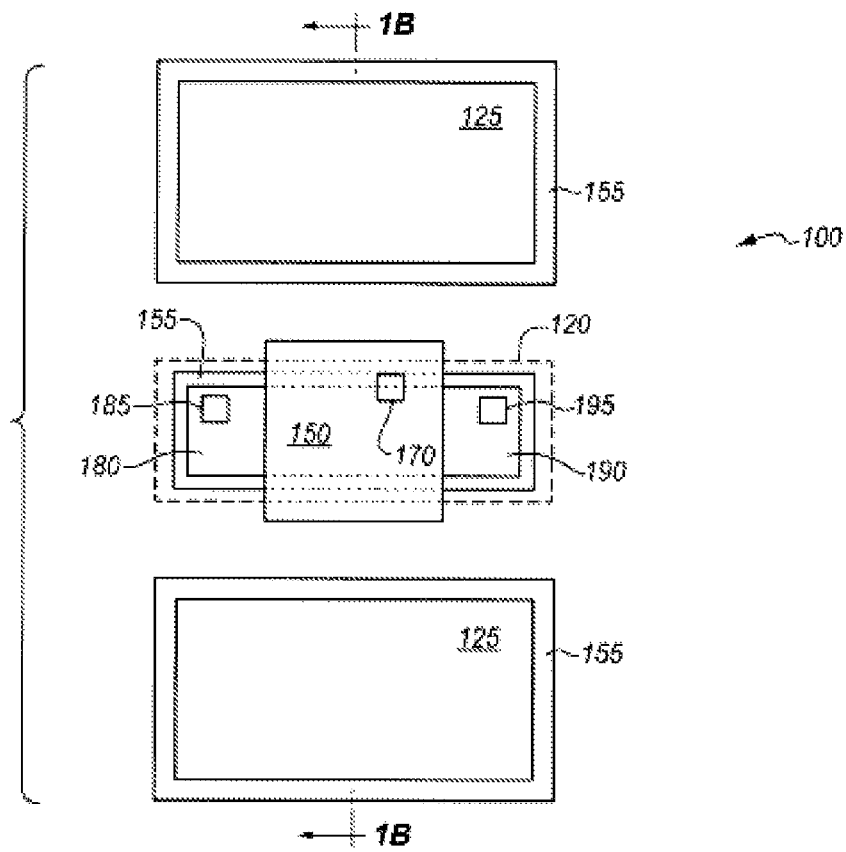
FIG. 1A is a diagram of a top view, partially delayered, of a conventional transistor structure that is implemented on the substrate of an integrated circuit.

According to one embodiment of the invention, the channel just underneath the source-follower gate area is widened. This can be done by removing most of the STI (Shallow Trench Isolation) under the gate electrode and, along with it, the adjacent STI protect doping feature. These two features effectively narrow transistor channels with which they are used. Widening the source-follower transistor channel under its polysilicon gate electrode can be used to reduce electron trapping at the STI interfaces at the edges of the channel.

In one embodiment of the invention, additional active area is added to the area between a transistor and an adjacent active area. This can enlarge the device width by avoiding an STI and STI protection implant (p-type for NMOS, n-type for PMOS). Instead of the STI structures, active area is added. The enlarged active area induces the electron flow from source to drain to be away from the STI sidewall. As a result, any electron trapping and detrapping along the STI sidewall and along the typical top corner of the STI may be significantly minimized.

Embodiments of a transistor having a wider active area under a gate are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. The term "or" as used herein is normally meant to encompass a meaning of an inclusive function, such as "and/or."

In general, integrated circuits comprise circuitry that is employed for a variety of applications. The applications use a wide variety of devices such as logic devices, imagers (including CMOS and CCD imagers), and memory (such as DRAM and NOR- and NAND-based flash memory devices). These devices normally employ transistors for a variety of functions, including switching and amplification of signals. The present invention is presented in the context of a CMOS (Complementary Metal Oxide Semiconductor) imaging integrated circuit, in the form of a camera chip, suitable for use with a camera for machine vision, recording, and communications, however the invention is not so limited.

The term "substrate" includes substrates formed using semiconductors based upon silicon, silicon-germanium, germanium, gallium arsenide, and the like. The term substrate may also refer to previous process steps that have been performed upon the substrate to form regions and/or junctions in the substrate. The term substrate can also include various technologies, such as doped and undoped semiconductors, epitaxial layers of silicon, and other semiconductor structures formed upon a substrate. While the invention is described in the context of transistors on a substrate, the structures may be formed on a substrate that may be later thinned.

FIG. 1A is a diagram of a top view of a conventional transistor structure 100 and related environment that can be implemented on the substrate of an integrated circuit for a light sensor array. The transistor may be a source-follower for a sensor array as described below or any other transistor. The transistor is built over a substrate into which a doped layer 120 or implant well is formed.

A source 180 and drain 190 of the transistor are disposed on either side of a central gate electrode 150. A source electrode contact 185, drain electrode contact 195 and gate electrode contact 170 allow for electrical connections to be made to the nodes of the transistor. Isolating structures 155 are formed surrounding the active area of the source, drain, and gate. The isolating structures 155 can be formed using processes such as shallow trench isolation (STI) or local oxidation of silicon (LOCOS). The STI may be surrounded by an STI protection implant layer 145 formed on either side of the STI.

Photosensitive areas 125 are formed in the doped layer on either side of the transistor. The photodiodes are also surrounded by an isolating structure 155, such as STI and protective implant 145 to isolate them from other nearby circuitry. In the illustrated example, the transistor can be a source-follower transistor between photodiodes of an image sensor array. However, the present invention is not so limited.

Figure 1B:
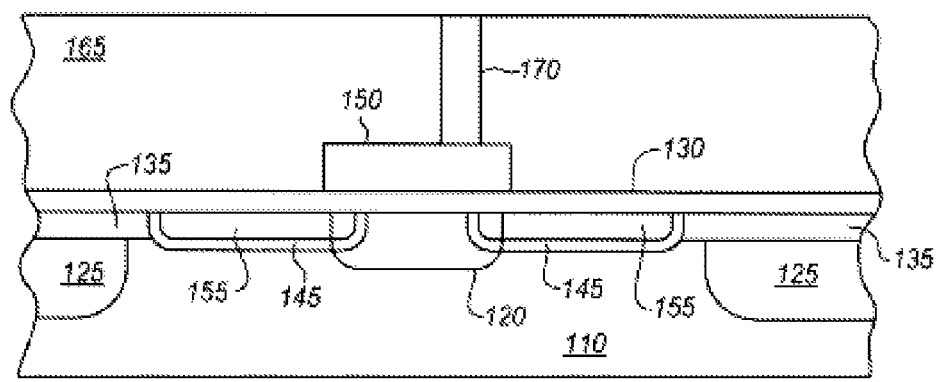
FIG. 1B is a diagram of a cross-sectional view along line B-B of the conventional transistor of FIG. 1A.

FIG. 1B is a diagram of a cross-section of the structure 100 of FIG. 1A taken along line B-B in FIG. 1A. The conventional transistor structure is implemented on a substrate 110 of an integrated circuit for a light sensor array. A doped layer 120 or implant well is formed in the substrate as the foundation for the transistor. The doped implant area 120 is normally formed having a conductivity or doping type (such as p-type). The substrate is normally of the same doping type, such as p-type.

Both the photosensitive areas and the transistor have associated active areas which are those substrate surface areas associated with each device that are enclosed and delineated at the surface of the substrate by STI regions. In the illustrated example, any surface regions enclosed by STI is an active area. The photosensitive areas 125 may be created by forming n-type doped regions which may extend deep into the substrate and various contact structures (not shown). The photodiodes are shown as a generalized shape in order to simplify the drawing. A pinning layer 135 is formed over the photodiodes as is well known.

The STI isolating structures 155 are formed adjacent to or inside the p-well 120 to isolate the transistor and also surrounding the photodiodes to isolate the photodiodes. An isolating structure 155, using an STI process, can be formed by etching a void within the doped layer 120 and depositing a dielectric material (such as silicon dioxide) within the void. The deposited dielectric material can be planarized using CMP. An STI protection implant layer 145 is formed on either side of the STI, typically after the void is formed but before the dielectric fill material of the STI is deposited. This can be formed by implanting an additional dopant material, such as boron into the doped silicon layer 120 to form a protective layer. The STI protection implant acts as a protection barrier and helps to keep the mobile carriers of a neighboring device away from STI defects, but if any portion of the protection implant reaches into the active area of the transistor it may consume some of the effective electrical width of the transistor channel portion of its active area.

The transistor gate includes a transistor gate electrode 150 formed over the gate oxide layer 130. A gate oxide layer 130 is grown on top of all active areas and, at the end of the fabrication process, remains at least in the intersection between the transistor gate electrode and the transistor active area. A dielectric layer 165 is formed over the central gate electrode 150 and the gate oxide layer 130.

The source and drain (not shown) of the transistor are disposed along an axis that is at right angles to the face of the cross-section shown in FIG. 1B. The source and drain are formed within the previously defined active area of the transistor. The area between the source and drain and under the gate in which transconductance occurs is the transistor channel region.

The transistor gate electrode 150 is typically composed of polysilicon and is formed over portions of the active area and portions of the isolating structure 155.

Additional layers, for example an insulating layer 165, among others, can be formed over the transistor gate electrode 150 and regions of the isolating STI structure 155 and protective implant 145. Metal contacts, for example contact 170, can be formed within the insulating layer by etching a cavity and filling the cavity with a metal. Metallization layers or other types of conductive traces can be formed over the metal contact and portions of insulating layers such that electrical connections can be made between the transistor gate electrode 150 and other devices formed within and upon the substrate 110.

Figure 2A:
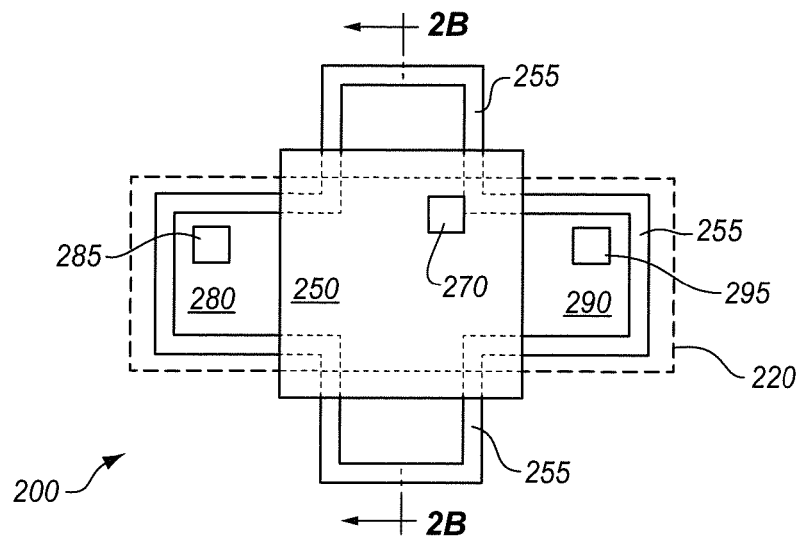
FIG. 2A is a diagram of a top view, partially delayered, of an improved transistor structure that is implemented on the substrate of an integrated circuit according to an embodiment of the invention.

FIG. 2A is a diagram of a top view of a novel transistor structure 200 with reduced RTS noise. This transistor can also be implemented on the substrate of an integrated circuit for a light sensor array, but the invention is not so limited. The transistor may be a source-follower for a sensor array as described below or any other transistor. The transistor is built over a substrate into which a doped layer 220 or implant well is formed.

A source 280 and drain 290 of the transistor are disposed on either side of a central gate 250. A source electrode contact 285, drain electrode contact 295 and gate electrode contact 270 allow for electrical connections to be made to the nodes of the transistor. Isolating structures 255, such as STI are formed surrounding the active area of the source, drain, and gate. The STI may be surrounded by an STI protection implant layer 245 (see e.g. FIG. 2B formed on either side of the STI.

In contrast to the STI structure of FIGS. 1A and 1B, in the example of FIG. 2A, the STI jogs out away from the normal boundary area of the active area under the gate electrode defining additional active area along a portion of the channel region as shown. The channel region in the conventional layout is an area with high current density during conduction of the transistor in which portions of the current flows from source to drain alongside the STI regions which bound it on two sides.

The interaction of the channel current and its bounding STI can be a significant cause of RTS noise. By displacing the STI under the gate electrode as shown in FIG. 2A and thereby expanding the active area along a portion of the transistor channel, there is reduced interaction by virtue of the increased separation of the channel current and the STI and reduced RTS noise is a result. However, this construction may affect the operation of the transistor since the channel width may not be constant along the length of the transistor. The channel width may also be affected by displacing the STI outwardly over portions of the length of the transistor.

Figure 2B:
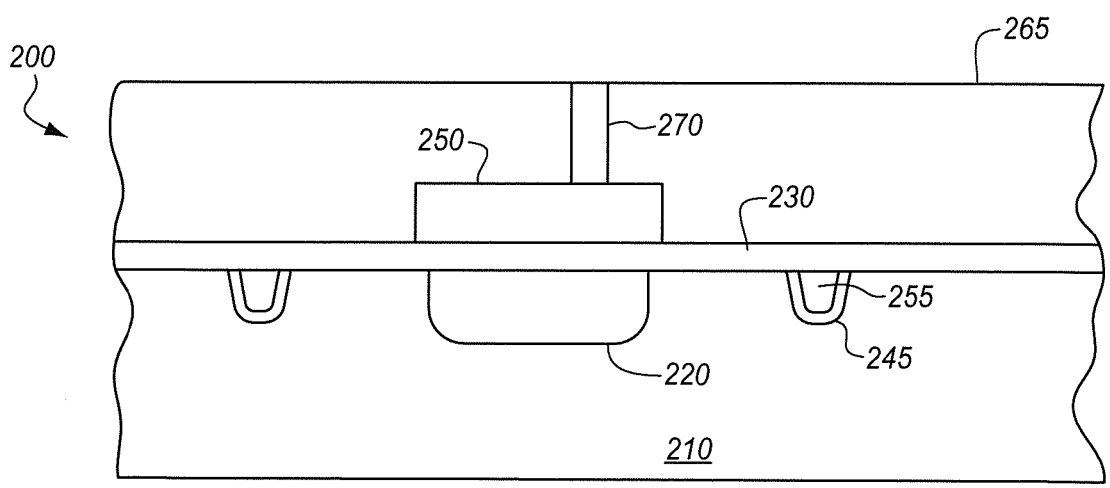
FIG. 2B is a diagram of a cross-sectional view along line B-B of FIG. 2A of the improved transistor structure of FIG. 2A according to an embodiment of the invention.

FIG. 2B is a diagram of the cross-section of the transistor structure of FIG. 2A taken along line B-B of FIG. 2A. In FIG. 2A, it can easily be seen that the STI 255 is further from the transistor channel region that lies inside the or implant well 220 of the transistor than in FIG. 1B. Also it can be seen that the STI protection implant layer 245 is also further from the transistor channel region. This allows for a wider channel in the transistor along a portion of its length, potentially improving its performance. In addition it reduces the RTS noise that might be caused by the STI near the channel.

As in FIG. 1B, the transistor is implemented on the substrate 210 of an integrated circuit. For a BSI (Back Side Illuminated) photo sensor, the substrate may be thinned to improve blue and green color response. Structure 200 includes a substrate 210 upon which a doped well implant layer 220 is formed (such as p-type). A protective isolating structure 255, such as STI with an STI protection implant layer 245 is formed on either side of the doped layer 220. A source and drain (not shown) are normally formed using material having a second conductivity type, such as n-type. A gate oxide layer 230 is formed over the channel and the STI.

A transistor gate electrode 250 is typically composed of polysilicon and in the cross-section of FIG. 2B is shown to be formed over regions of the gate oxide layer 230. Additional layers, for example an insulating layer 265, among others, can be formed over the transistor gate electrode 250 and regions of the isolating structure 255 and protective implant 245.

Metal contacts, for example contact 270 can be formed within the insulating layer by etching a cavity and filling the cavity with a metal. Metallization layers or other types of conductive traces can be formed over the metal contact and portions of insulating layers such that electrical connections can be made between the transistor gate electrode 250 and other devices formed within and upon the substrate.

Figure 3A:
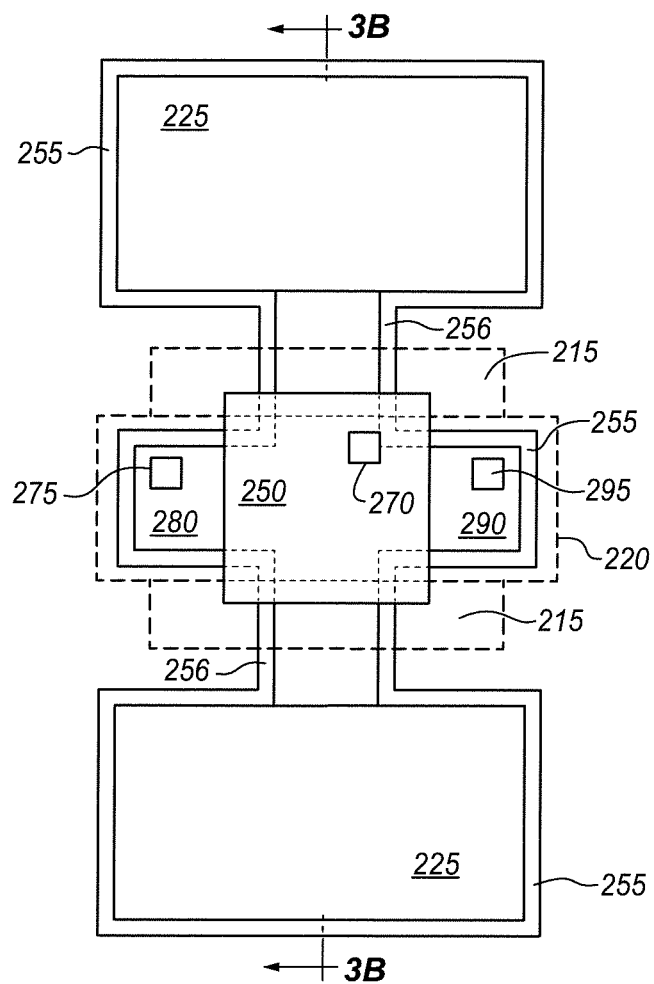
FIG. 3A is a diagram of a top view, partially delayered, of an improved transistor structure with adjacent photodiodes that is implemented on the substrate of an integrated circuit according to an embodiment of the invention.

FIG. 3A shows the same transistor structure as in FIG. 2A, modified to accommodate a photodiode 225 on either side of the transistor. These photodiodes are similar to those of FIGS. 1A and 1B. As in FIGS. 1A and 2A, the diagram resembles a plan view partially delayered. The gate electrode 250 is coupled to a gate electrode contact 270. A source 275 with a contact 280 is on one side of the gate while a drain 290 and contact 295 are on the other side of the gate. The transistor is formed in an active area 220 between the source 275 and the drain 290 in the implant well 220 that is situated between the two n-type photodiodes 225. The source 280 and drain 290 are formed as n-type implants and are isolated from the n-type photodiodes by the p-type well 220 in which the source and drain sit. The source and drain are also isolated by the p-type substrate that underlies the entire structure and by STI layers 255 where those exist. Where the STI is absent between the n-type photodiodes and the transistor, the p-type implant wells 215 may also isolate the n-type photodiodes from the transistor.

In the illustrated example, STI 255 is used to isolate the photodiodes and the active areas and the source-follower from any external components and, in part, from each other. While the STI layer is shown as a single layer in this and some of the other drawings, it may also include an implanted protection layer, such as the boron protection implant layer 145 as shown in FIG. 1B.

In contrast to FIG. 2A, the STI 255 in FIG. 3A does not completely surround and isolate the channel of the transistor. Instead, the STI barrier turns away from the transistor active area and runs toward the photodiode 225. This occurs near the edge of the gate electrode on both sides of the gate. The STI barrier then joins with the STI barrier of the photodiode. Similarly, the STI barrier of the photodiode does not completely surround the photodiode but turns away from the photodiode and toward the transistor gate electrode. This leaves a portion of the active area of the transistor unshielded by a protective STI isolation trench. It also leaves the part of the photodiode closest to the gate unshielded by a protective STI isolation trench. As a result, the active area of the transistor has no STI along a portion of its channel and RTS noise is reduced.

As shown in FIG. 3A, an additional line of STI 256 runs between the periphery of the transistor and the periphery of the photodiode. Typically this line will include a protective implant layer (not shown separately) as well. This line connects the STI of the transistor and the STI of the nearest photodiode. While these lines effectively isolate the transistor and photodiode from other nearby components (not shown), they do not isolate the transistor and photodiode from each other. For this, an additional p-well 215 is formed at the edge of the transistor and the photodiode.

The STI barrier defines the width of the source-follower channel by defining the active area width where the source 280 and the drain 290 meet the channel at the edges of the gate electrode 250. However, a central area of the source-follower channel, does not have an STI layer defining it. In this central area of the source-follower that is contained within and along the length of the doped layer 220, the channel width is defined by the additional p-well 215.

Figure 3B:
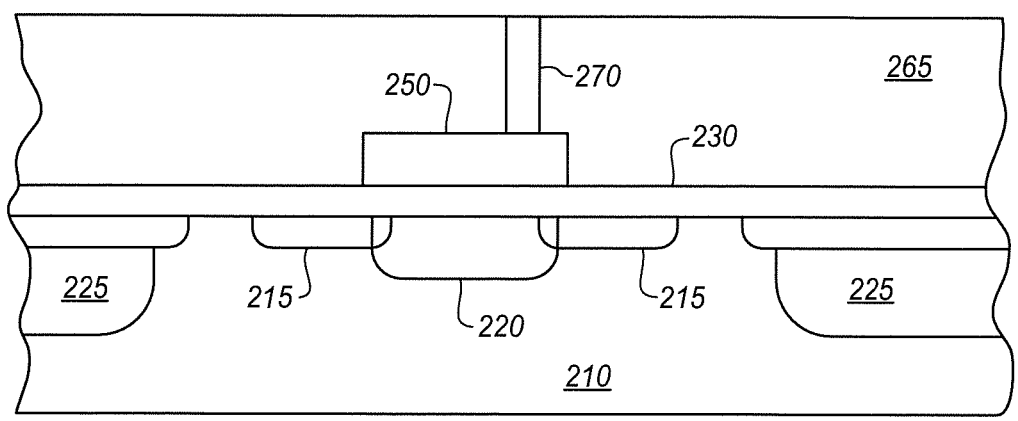
FIG. 3B is a diagram of a cross-sectional view along line B-B of FIG. 3A of the improved transistor structure of FIG. 3A according to an embodiment of the invention.

Referring to FIG. 3B, the additional p-well 215 can be seen on either side of the transistor channel and overlapping the doped layer 220. FIG. 3B is a diagram of a cross-section of the alternative transistor structure of FIG. 3A taken along B-B in FIG. 3A. The transistor of FIG. 3B is essentially the same as that of FIG. 2B, except for the pattern of the STI and the additional p-wells. As shown, the active area of the central portion of the channel of FIG. 3B is larger than the corresponding area of FIG. 2B. This extra active area has come primarily at the expense of the STI isolating areas and the STI protection implant which no longer bounds or defines the channel width in that region.

The additional p-well 215 serves to isolate the source-follower channel from the photodiode. The additional p-type well 215 may typically be of the same or a higher doping concentration than the p-doped well 220. The additional p-type well 215 may typically have a doping concentration equivalent to that of protective implant 245.

For a photo sensor array, the elimination of a portion of the STI areas along the source follower channel length, as shown, provides for a somewhat wider channel and greatly reduces sources of RTS noise. The particular shapes, positions, and relative sizes may be modified to suit any particular application.

Figure 4:
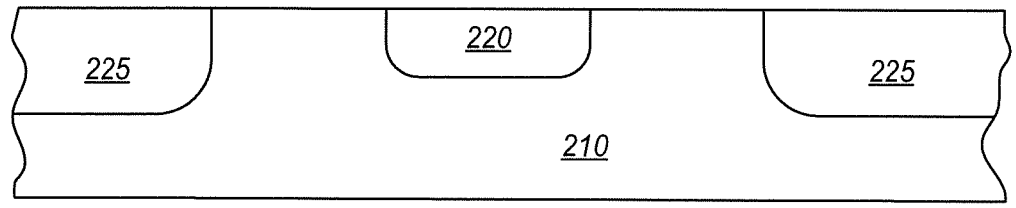
FIG. 4 is a diagram of a cross-sectional view of starting layers of the transistor of FIG. 3B including implant wells according to an embodiment of the invention.
Figure 5:
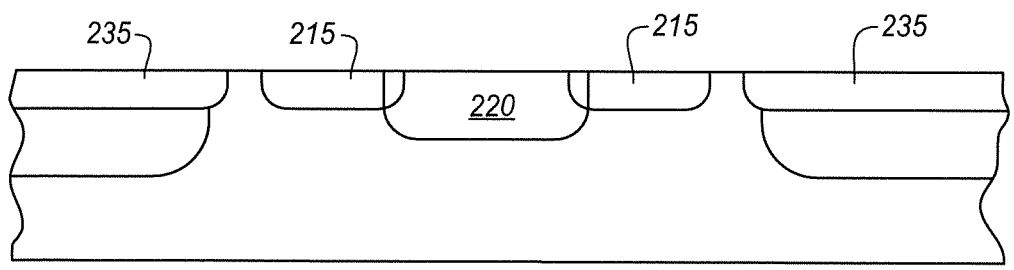
FIG. 5 is a diagram of a cross-sectional view of the structure of FIG. 4, including protective implants according to an embodiment of the invention.
Figure 6:
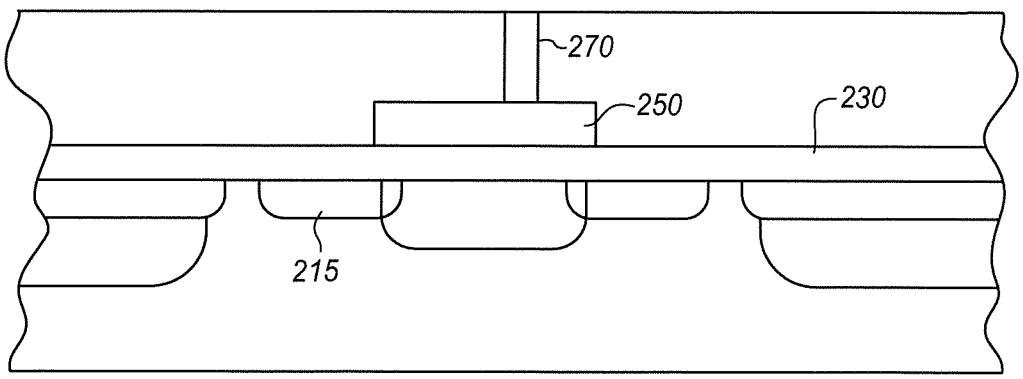
FIG. 6 is a diagram of a cross-sectional view of the structure of FIG. 5, including a gate oxide and a gate electrode according to an embodiment of the invention.

FIGS. 4-6 are diagrams of the transistor structure of FIG. 3B at different stages of formation. FIG. 4 shows a substrate 210 upon which a doped layer 220 is formed as a well implant. The doped layer 220 is normally formed having a first conductivity type. For example, the first conductivity type can be a p-type, and the second conductivity type can be an n-type or vice versa. The doped layer 220 can be, for example, a p-well formed in a p-type substrate. Various levels of dopant implantations can be applied to form various structures and/or adjust transistor voltage thresholds. In one example, the doped layer 220 is doped at concentrations of $10^{13}$/cc to $10^{15}$/cc. The central doped layer contains an active area for the transistor.

Similarly n-doped areas 225 can be formed for photodiodes on either side of the transistor. The photodiodes may be doped to $10^{14}$/cc to $10^{16}$/cc, depending on the particular implementation. Additional components can be formed in additional wells, depending on the particular embodiment. These deposition areas can be formed using photoresist to cover some areas while dopants are deposited over other areas and then the photoresist is removed, as is known in the art.

In FIG. 5, isolating structures 215 can be formed as wells on either side of the doped well 220. The isolating structures 215 are formed beside or abutting or overlapping the doped wells 220 and can be formed by doping or implanting of the first conductivity type, for example, p-type. In addition, pinning layers 235 are formed over the photodiode regions 225. Typically, the isolating areas are masked while the central p-type well and photodiode areas are formed. Then, the central well is masked while the p-type isolating areas are formed in the remaining portions of the active area.

FIG. 6 shows the structure after a gate oxide layer 230 is formed by growing a film of silicon dioxide on the surface of the active area, i.e. anywhere there is no STI. In addition to the gate oxide layer 230, isolation and protection implant areas (not shown) may be added as needed, such as to either side of the STI regions. A layer of polysilicon is deposited for the transistor gate electrode 250. As shown, the gate oxide 230 separates the gate electrode 250 from the protection implant areas 215. The gate electrode 250 may extend over the tops of the gate oxide regions and isolation regions 215. The gate electrode 250 can be formed by depositing a layer of polycrystalline silicon, polysilicon/silicide, and/or any other suitable conductor or metal. Suitable metals include Ni, W, Ti, Co and silicides of these and other metals. Sidewall insulating spacers (not shown) can also be formed using conventional processes.

The source and drain (not shown) may have already been formed before the gate oxide 250 and isolating areas 245 are formed, but usually are formed after the gate oxide. These lie in front of and behind the plane of the cross-section shown in the figures as indicated in FIGS. 2A and 3A. The gate electrode 250 can be patterned using resist and etching methods.

In one embodiment, a contact etch stop layer (not shown) may be deposited over the gate electrode of the transistor. The contact etch stop layer can be Ti, TiN, or a suitable material having a low resistivity. The etch stop layer can be subsequently used in conjunction with an etch and can be thinned using CMP. Deposited and planarized insulation layers, 265 such as BPSG (Borophosphosilicate Glass), PSG (Phosposilicate Glass), BSG (Borosilicate Glass), and the like may also be added to finish the devices. The insulating layers can be planarized using, e.g. CMP, resist etch-back, or spun-on glass (SOG) to form the resulting structure. Following the deposition of the insulating layer, contacts and electrical connections can also be formed.

A gate electrode contact 270 can be formed by first forming a void by etching or in some other way. A contact etch stop layer can be used to control the depth of the etching. The contact etching can be stopped at the gate electrode surface or can be allowed to progress within the gate electrode. Gate contacts can then be formed in any of a variety of different ways, for example, by depositing a layer of metal over and within the voids etched into the insulating layer. Metallization layers and additional insulting layers may be added to suit any particular application. The contacts are coupled to other components or circuitry that is not shown in order to simplify the drawing.

Figure 7:
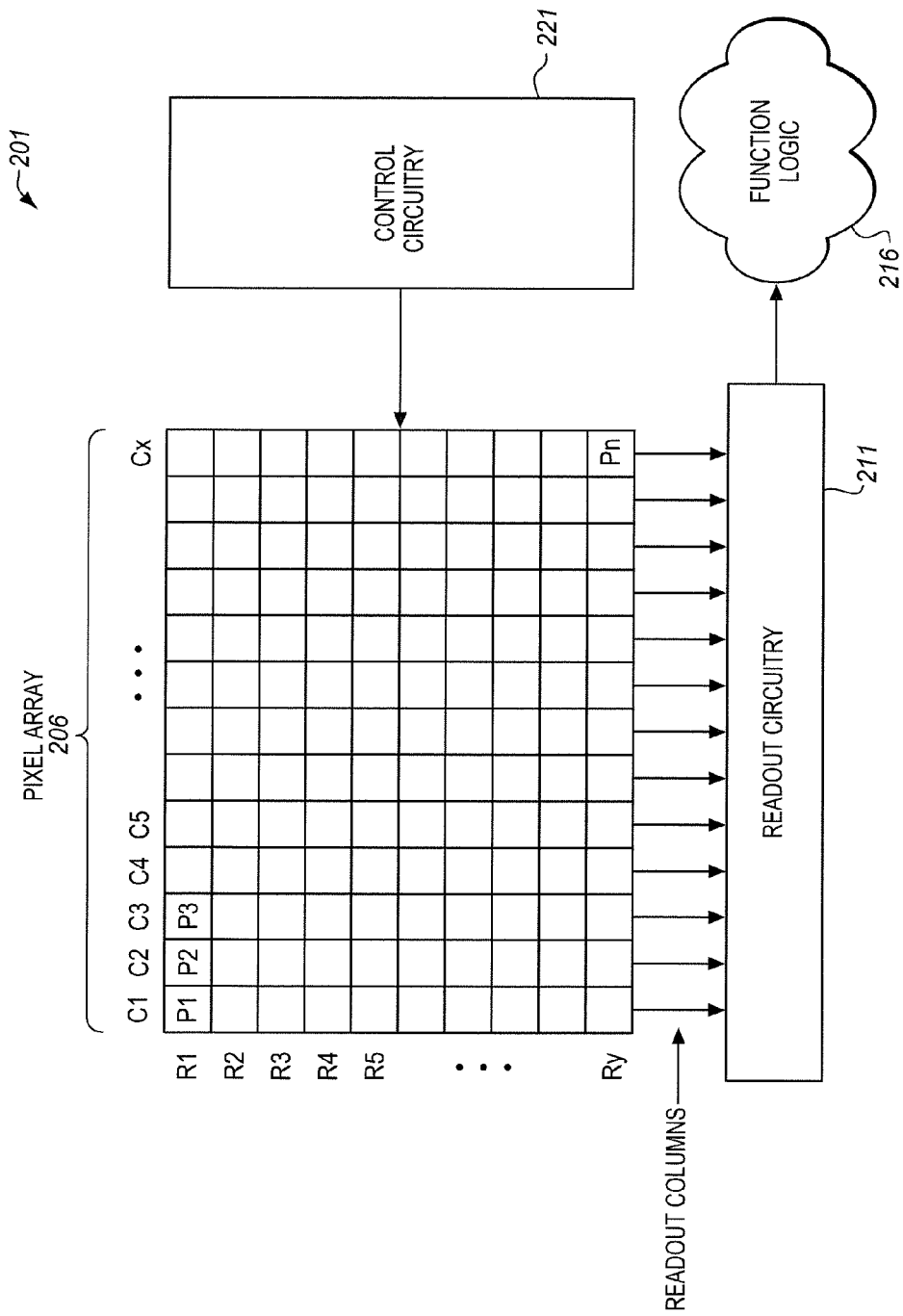
FIG. 7 is a block diagram illustrating a backside illuminated imaging system, according to an embodiment of the invention.

FIG. 7 is a block diagram illustrating a backside illuminated imaging system 201, to which embodiments of the invention may be applied. The illustrated embodiment of the imaging system 201 includes a pixel array 206, readout circuitry 211, function logic 216, and control circuitry 221.

The pixel array 206 is a two-dimensional ("2D") array of backside illuminated imaging sensors or pixels (e.g., pixels P1, P2 . . . , Pn). In one embodiment, each pixel is a complementary metal-oxide-semiconductor (CMOS) imaging pixel. As illustrated, each pixel is arranged into a row (e.g., rows R1 to Ry) and a column (e.g., column C1 to Cx) to acquire image data of a person, place, or object, which can then be used to render a 2D image of the person, place, or object.

After each pixel has acquired its image data or image charge, the image data is read out by readout circuitry 211 and transferred to function logic 216. The readout circuitry 211 may include amplification circuitry, analog-to-digital ("ADC") conversion circuitry, or otherwise. The function logic 216 may simply store the image data or also manipulate the image data by applying post image effects (e.g., crop, rotate, remove red eye, adjust brightness, adjust contrast, or otherwise). In one embodiment, the readout circuitry 211 may read out a row of image data one row at a time along readout column lines (illustrated) or may read out the image data using a variety of other techniques (not illustrated), such as a serial readout or a full parallel readout of all pixels simultaneously.

The control circuitry 221 is coupled to the pixel array 206 to control operational characteristic of the pixel array 206. For example, the control circuitry 221 may generate a shutter signal for controlling image acquisition. In one embodiment, the shutter signal is a global shutter signal for simultaneously enabling all pixels within pixel array 206 to simultaneously capture their respective image data during a single acquisition window. In an alternative embodiment, the shutter signal is a rolling shutter signal whereby each row, column, or group of pixels is sequentially enabled during consecutive acquisition windows.

Figure 8:
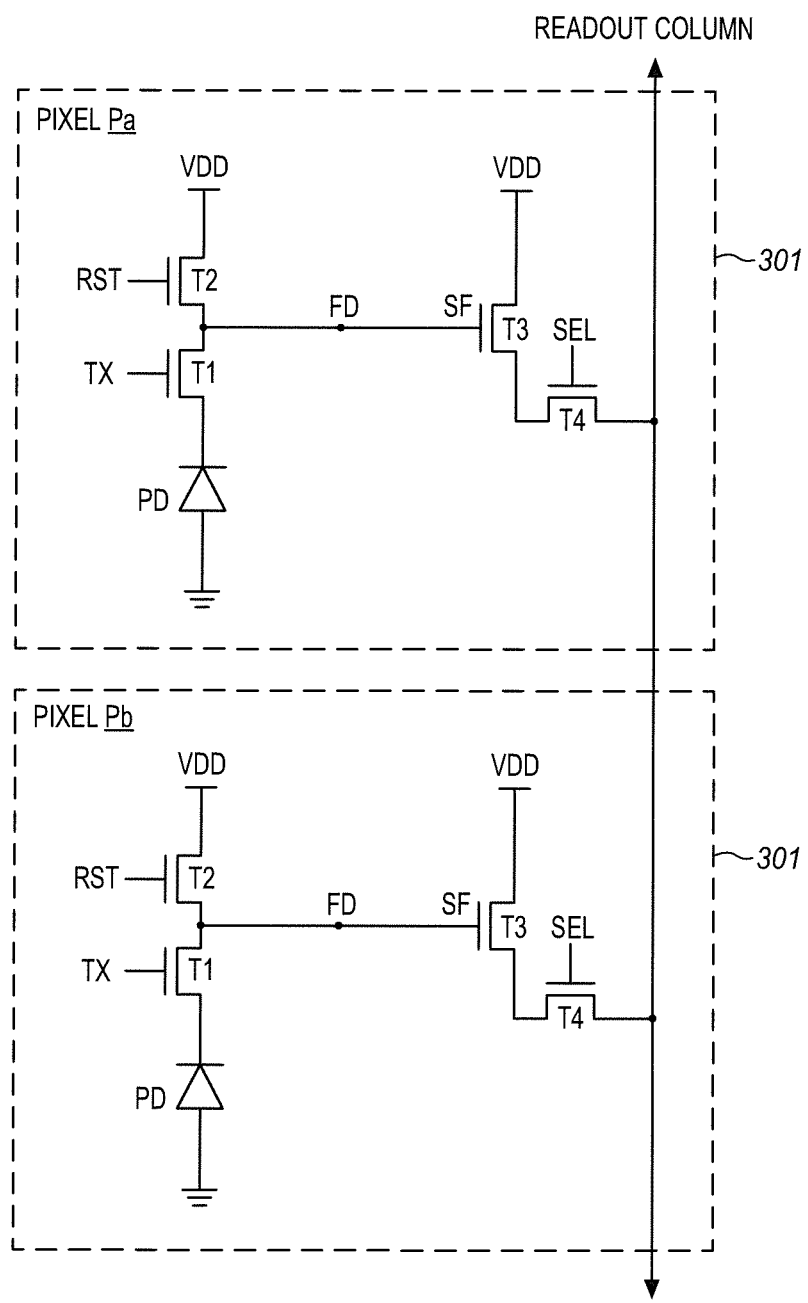
FIG. 8 is a circuit diagram illustrating pixel circuitry of two 4T pixels within a backside illuminated imaging system, according to an embodiment of the invention.

FIG. 8 is a circuit diagram illustrating pixel circuitry 301 of two four-transistor ("4T") pixels within a backside illuminated imaging array, in accordance with an embodiment of the invention. The illustrated pixel circuitry 301 is one possible pixel circuitry architecture for implementing each pixel within the pixel array 201 of FIG. 2. However, it should be appreciated that embodiments of the present invention are not limited to 4T pixel architectures; rather, one of ordinary skill in the art having the benefit of the present disclosure will understand that the present teachings are also applicable to 3T designs, 5T designs, and various other pixel architectures.

In FIG. 8, pixels Pa and Pb are arranged in two rows and one column. The illustrated embodiment of each pixel circuitry 301 includes a photodiode PD, a transfer transistor T1, a reset transistor T2, a source-follower ("SF") transistor T3, a select transistor T4, and a storage capacitor C1. During operation, the transfer transistor T1 receives a transfer signal TX, which transfers the charge accumulated in photodiode PD to a floating diffusion node FD. In one embodiment, floating diffusion node FD may be coupled to a storage capacitor for temporarily storing image charges.

The reset transistor T2 is coupled between a power rail VDD and the floating diffusion node FD to reset the pixel (e.g., discharge or charge the FD and the PD to a preset voltage) under control of a reset signal RST. The floating diffusion node FD is coupled to control the gate of the SF transistor T3. The SF transistor T3 is coupled between the power rail VDD and the select transistor T4. The SF transistor T3 operates as a source-follower providing a high impedance connection to the floating diffusion FD. Finally, the select transistor T4 selectively couples the output of pixel circuitry 300 to the readout column line under control of a select signal SEL.

In one embodiment, the TX signal, the RST signal, and the SEL signal are generated by control circuitry 221. In an embodiment where pixel array 206 operates with a global shutter, the global shutter signal is coupled to the gate of each transfer transistor T1 in the entire pixel array 206 to simultaneously commence charge transfer from each pixel's photodiode PD. Alternatively, rolling shutter signals may be applied to groups of transfer transistors T1.

Figure 9:
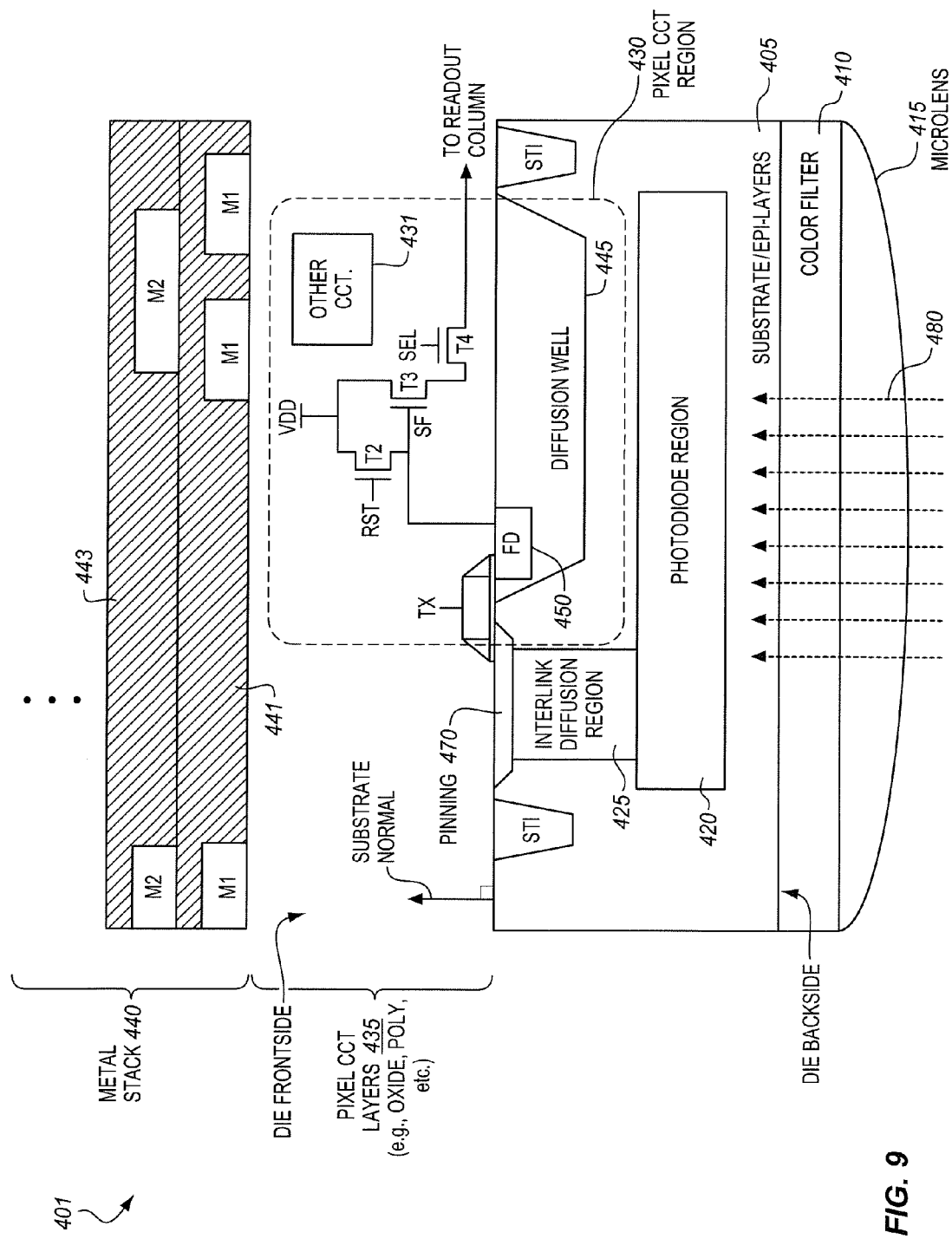
FIG. 9 is a hybrid cross sectional and circuit diagram of a backside illuminated imaging pixel with overlapping pixel circuitry, according to an embodiment of the invention.

FIG. 9 is a hybrid cross sectional and circuit diagram of a backside illuminated imaging pixel 401 with overlapping pixel circuitry, in accordance with an embodiment of the invention. Imaging pixel 401 is one possible implementation of pixels P1 to Pn within pixel array 206. The illustrated embodiment of the imaging pixel 401 includes a substrate 405, a color filter 410, a microlens 415, a PD region 420, an interlinking diffusion region 425, a pixel circuitry region 430, pixel circuitry layers 435, and a metal stack 440. The illustrated embodiment of the pixel circuitry region 430 includes a 4T pixel (other pixel designs may be substituted), as well as other circuitry 431 (e.g., gain circuitry, ADC circuitry, gamma control circuitry, exposure control circuitry, etc.), disposed over a diffusion well 445.

A floating diffusion 450 is disposed within the diffusion well 445 and coupled between the transfer transistor T1 and the gate of the SF transistor T3. The illustrated embodiment of the metal stack 440 includes two metal layers M1 and M2 separated by inter-metal dielectric layers 441 and 443. Although FIG. 9 illustrates only a two layer metal stack, the metal stack 440 may include more or less layers for routing signals over the frontside of the pixel array 206. In one embodiment, a passivation or pinning layer 470 is disposed over the interlinking diffusion region 425. Finally, STI areas isolate the imaging pixel 401 from the adjacent pixels (not illustrated).

As illustrated, the imaging pixel 401 is photosensitive to light 480 incident on the backside of its semiconductor die. By using a backside illuminated sensor, the pixel circuitry region 430 can be positioned in an overlapping configuration with the photodiode region 420. In other words, the pixel circuitry 300 can be placed adjacent to the interlinking diffusion region 425 and between the photodiode region 420 and the die frontside without obstructing light 480 from reaching the photodiode region 420.

By placing the pixel circuitry in an overlapping configuration with the photodiode region 420, as opposed to a side-by-side configuration, the photodiode region 420 no longer competes for valuable die real estate with the pixel circuitry. Rather, the pixel circuitry region 430 can be enlarged to accommodate additional or larger components without detracting from the fill factor of the image sensor. Embodiments of the present invention enable other circuits 431, such as gain control or ADC (Analog to Digital Converter) circuitry (e.g., ADC 305), to be placed in close proximity to a respective photodiode region 420 without decreasing the sensitivity of the pixel. By inserting gain control and ADC circuitry in close proximity to each PD region 420, circuit noise can be reduced and noise immunity improved due to shorter electrical interconnections between the PD region 420 and the additional in-pixel circuitry. Furthermore, the backside illumination configuration provides greater flexibility to route signals over the frontside of the pixel array 206 within the metal stack 440 without interfering with light 480. In one embodiment, the shutter signal is routed within the metal stack 440 to the pixels within the pixel array 206.

In one embodiment, the pixel circuit regions 430 over the PD regions 420 of the adjacent pixels within the pixel array 206 can be grouped to create communal die real estate. This communal die real estate can support shared circuitry (or inter-pixel circuitry) in addition to the basic 3T, 4T, 5T, etc. pixel circuitry. Alternatively, some pixels can donate their unused die real estate above their PD regions 420 to an adjacent pixel requiring additional pixel circuitry space for larger or more advanced in-pixel circuitry. Accordingly, in some embodiments, other circuitry 431 may overlap two or more PD regions 420 and may even be shared by one or more pixels.

In one embodiment, the substrate 405 is doped with p-type dopants. In this case, the substrate 405 and the epitaxial layers grown thereon may be referred to as a p substrate. In a p-type substrate embodiment, the diffusion well 445 is a P+ well implant while the photodiode region 420, interlinking the diffusion region 425, and the floating diffusion 450 are n-type doped. The floating diffusion 450 is doped with an opposite conductivity type dopant from the diffusion well 445 to generate a p-n junction within the diffusion well 445, thereby electrically isolating the floating diffusion 450. In an embodiment where the substrate 405 and the epitaxial layers thereon are n-type, the diffusion well 445 is also n-type doped, while the photodiode region 420, the interlinking diffusion region 425, and the floating diffusion 450 have an opposite p-type conductivity.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An electrical circuit comprising:
a complementary metal oxide semiconductor transistor of an image sensor having a source, a drain, and a gate electrode between the source and the drain, the transistor having an active area under the gate electrode that forms a channel between the source and the drain under the influence of the gate electrode; and
an isolation barrier disposed along outer edges of the source and the drain that are not disposed directly beneath the gate electrode, the isolation barrier continuing underneath the gate electrode and then jogging out away from the active area while still being disposed beneath the gate electrode, wherein limiting sections of the isolation barrier that continue underneath the gate electrode before jogging out away from the active area isolate the channel to a first width, and wherein jogging sections of the isolation barrier that jog away from the active area will allow the channel to become wider than the first width.

2. The electrical circuit of claim 1, wherein the isolation barrier comprises shallow trench isolation.

3. The electrical circuit of claim 1, further comprising a photodiode of the image sensor, the transistor having a first conductivity type and the photodiode having a second conductivity type, wherein a central portion of the channel is allowed to become wider than the first width, and wherein the isolation barrier is absent under the gate electrode between the central portion of the channel and the photodiode.

4. The electrical circuit of claim 3, further comprising an isolation area between the channel and the photodiode, the isolation area having the first conductivity type to isolate the channel from the photodiode.

5. The electrical circuit of claim 3, wherein the transistor comprises a source-follower transistor and wherein the isolation barrier comprises shallow trench isolation between the transistor source and the photodiode and between the transistor drain and the photodiode.

6. The electrical circuit of claim 4, wherein the isolation area is to isolate the channel without the isolation barrier.

7. The electrical circuit of claim 4, wherein the isolation area is doped to have the first conductivity type and wherein the isolation area is doped to an equal or higher concentration than the channel.

8. The electrical circuit of claim 4, wherein the central portion of the channel abuts the isolation area and wherein the photodiode is adjacent to the isolation area.

9. The electrical circuit of claim 6, wherein the central portion of the channel underlying the gate of the transistor is isolated by the isolation area.

10. A photo sensor array comprising:
a plurality of complementary metal oxide semiconductor source-follower transistors each formed within a respective well of a semiconductor material, the wells having a first conductivity type, each transistor having a source, a drain and an active region for forming a channel underlying the gate;
a plurality of photodiodes formed in the semiconductor material, each formed in a well of a second opposite conductivity type and having a detector area;
an isolation barrier disposed along edges of the source and the drain that face away from the gate electrode, the isolation barrier continuing underneath the gate electrode and then extending away from the active area while still being disposed beneath the gate electrode, wherein limiting sections of the isolation barrier that continue underneath the gate electrode before extending away from the active area limit each respective channel to a first width, and wherein extending sections of the isolation barrier that extend away from the active area allow each respective channel to become wider than the first width; and
an isolation area between a central portion of each respective channel and a corresponding photodiode, the isolation area being formed within the semiconductor material as a well of the first conductivity type to isolate the transistor from the photodiode.

11. The photo sensor array of claim 10, wherein the isolation barrier includes shallow trench isolation, and wherein the isolation barrier is disposed between the source and the photodiode and between the drain and the photodiode.

12. The photo sensor array of claim 10, wherein the isolation area abuts the central portion of each respective channel.

13. The photo sensor array of claim 10, wherein the isolation area is distanced away from the central channel.

14. The photo sensor array of claim 10, wherein the transistor is formed in a p-type implant well of the semiconductor material and wherein the isolation area is formed as a p-type implant well having a doping that is equal to or higher than the doping of the transistor implant well.

* * * * *